ись

(12) United States Patent
Yamauchi

(10) Patent No.: US 7,736,990 B2
(45) Date of Patent: Jun. 15, 2010

(54) SEMICONDUCTOR DEVICE AND MANUFACTURING METHOD FOR THE SAME

(75) Inventor: Hiroshi Yamauchi, Fukuyama (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 12/270,659

(22) Filed: Nov. 13, 2008

(65) Prior Publication Data

US 2009/0121310 A1 May 14, 2009

(30) Foreign Application Priority Data

Nov. 14, 2007 (JP) ............................. 2007-295890

(51) Int. Cl.
*H01L 21/76* (2006.01)
(52) U.S. Cl. ................. 438/424; 438/427; 438/221; 257/510
(58) Field of Classification Search ................. 438/424, 438/427, 221; 257/510, E21.55, E21.585, 257/E21.548
See application file for complete search history.

(56) References Cited

U.S. PATENT DOCUMENTS

2004/0232513 A1* 11/2004 Chi et al. .................... 257/510

2006/0134850 A1* 6/2006 Lim ........................... 438/221

FOREIGN PATENT DOCUMENTS

| JP | 10-189708 | 7/1998 |
|----|-----------|--------|
| JP | 2002-252279 | 9/2002 |
| JP | 2005-175110 | 6/2005 |

* cited by examiner

*Primary Examiner*—Theresa T Doan
(74) *Attorney, Agent, or Firm*—Morrison & Foerster LLP

(57) ABSTRACT

A method for manufacturing a semiconductor device comprising the steps of: forming a first insulating film to be used as a mask for forming a trench region directly above a semiconductor substrate; forming the trench region on the semiconductor substrate using the mask; forming a second insulating film directly above the semiconductor substrate which includes the trench region and the first insulating film so that the second insulating film has a recess above the trench region and a protrusion above the first insulating film; removing the protrusion down to the bottom of the recess as a first removal step; and removing the first insulating film and the second insulating film in accordance with a chemical mechanical polishing method so that the step formed of the recess and protrusion is reduced to 20 nm or less as a second removal step.

7 Claims, 6 Drawing Sheets

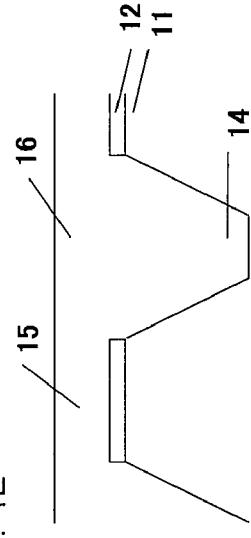
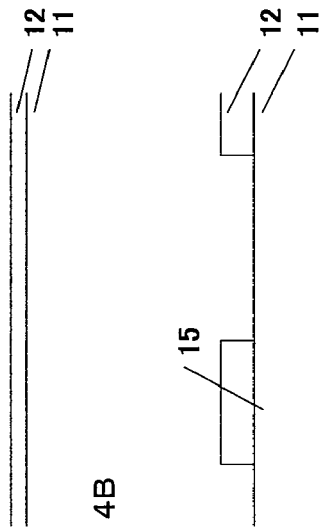
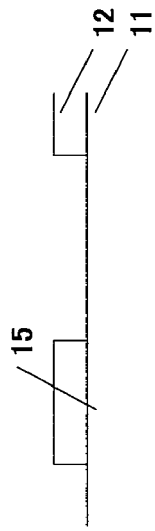
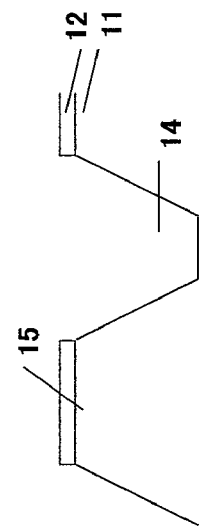
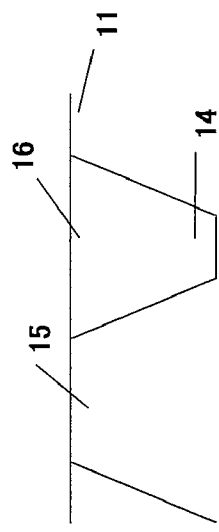
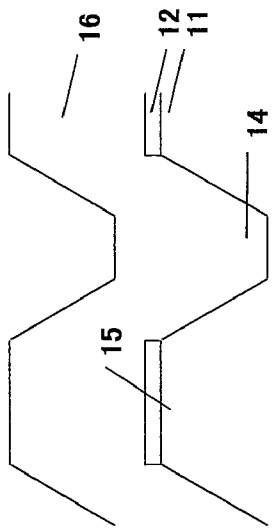
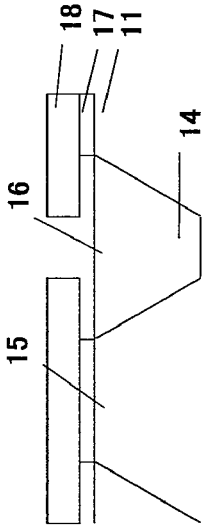
Fig. 4A
Fig. 4B
Fig. 4C
Fig. 4D
Fig. 4E
Fig. 4F
Fig. 4G

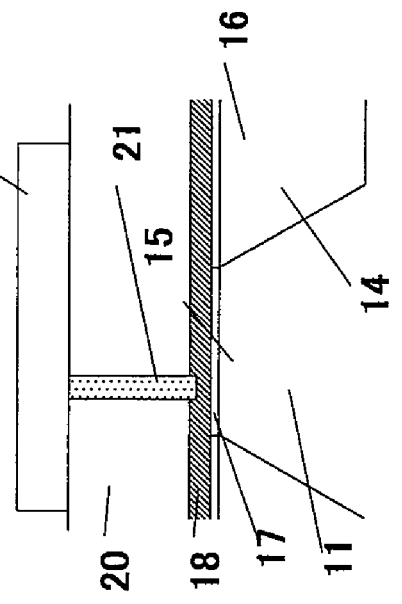
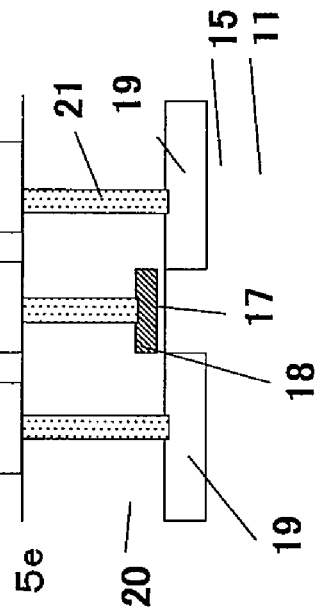
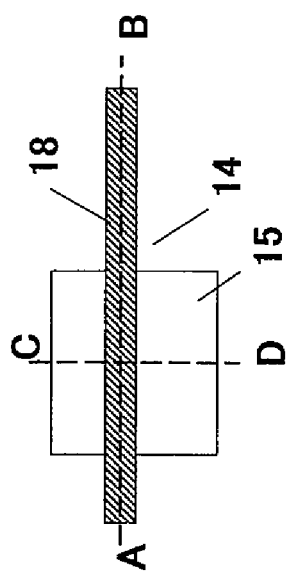
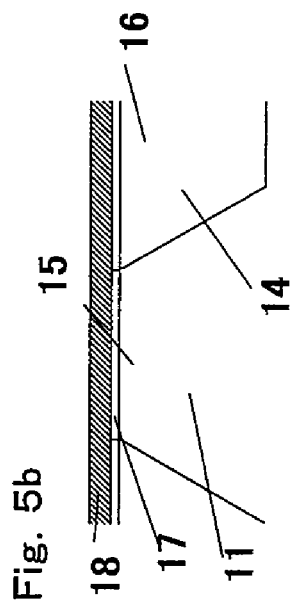
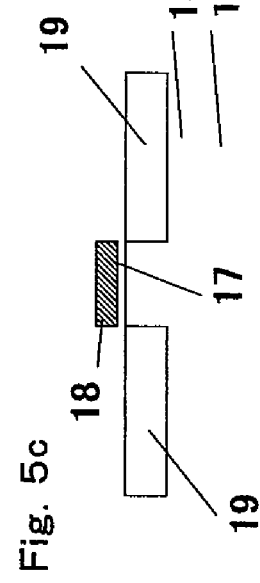

SEMICONDUCTOR DEVICE AND MANUFACTURING METHOD FOR THE SAME

CROSS-REFERENCE TO RELATED APPLICATION

This application is related to Japanese application No. 2007-295890 filed on Nov. 14, 2007, whose priority is claimed and the disclosure of which is incorporated by reference in its entirety.

BACKGROUND OF THE INVENTION

1. Field of the Invention

The present invention relates to a semiconductor device and a method for manufacturing the same. In particular, the present invention relates to a method for manufacturing a semiconductor device which is appropriate for shallow trench isolation (STI) processes used to electrically isolate a great number of elements, as well as a semiconductor device obtained in accordance with this method.

2. Description of Related Art

In general, semiconductor devices have a configuration where a great number of cells made up of unit elements (for example, several thousand to several hundred million), such as transistors and capacitors, are integrated within an area restricted in accordance with the capacity of the semiconductor device. It is necessary for these unit elements to be electrically isolated (insulated) from each other so that they operate independently.

As a method of electrical isolation, LOCOS (local oxidation of silicon) methods in which recesses are formed on a semiconductor substrate and then a field oxide film is grown, and trench isolation methods in which a semiconductor substrate is etched in the vertical direction so that trench regions are formed, and then the trench regions are embedded with an insulating film, are widely known. Here, trench regions include not only regions in a plane but also regions which spread in the direction of the depth.

From among these methods, the LOCOS methods are simple and have fewer problems caused by stress from the oxide film, because the semiconductor substrate is thermally oxidized using a nitride film as a mask. Therefore, the LOCOS methods have an advantage, such that the quality of the obtained oxide film is excellent.

However, the area occupied by the element isolation regions is large in the LOCOS methods, and therefore, there are problems in terms of miniaturization and a problem arises, such that bird's beaks are formed.

Meanwhile, the trench isolation methods are methods in which a dry etching technology, such as reactive ion etching (RIE) or plasma etching is used to form narrow and deep trench regions, which are then embedded with an insulating film. In to these methods, the trench regions formed on the semiconductor substrate are embedded with an insulating film, and therefore, no bird's beaks are formed.

In addition, the surface of the insulating film with which the trench regions are embedded is flattened, and therefore, the area occupied by the element isolation regions becomes small. Thus, the trench isolation methods have an advantage, such that active regions (regions where unit elements are formed) can be secured as much as possible. In addition, in the element isolation regions obtained according to these methods, the junction leak current can be reduced in comparison with the LOCOS methods.

A trench isolation method is shown in, for example, Japanese Unexamined Patent Publication 2002-252279.

FIG. 1 is a schematic cross sectional diagram showing the semiconductor device in this gazette, and FIGS. 2A to 2H are cross sectional diagrams schematically illustrating the steps in the manufacturing method. The method for manufacturing the semiconductor device in FIG. 1 is described below in reference to FIGS. 2A to 2H.

First, a semiconductor substrate 1 is thermally oxidized so that a pad oxidation film 2 is formed. Next, a nitride film (stopper film) 3 is deposited on the pad oxide film 2 in accordance with a chemical vapor deposition method (FIG. 2A). Next, a photosensitive film is applied over the entire surface of the semiconductor substrate 1 on which the pad oxide film 2 and the nitride film 3 are formed, and the substrate is exposed to light through a mask where a trench pattern is formed, followed by development, so that a photosensitive film pattern for forming trench regions is formed.

Next, the nitride film 3 and the pad oxide film 2 are etched and removed where not covered by the photosensitive film pattern (FIG. 2B), and after that, the semiconductor substrate 1 is etched to a certain depth where not covered by the nitride film 3 and the pad oxide film 2, so that trench regions 4 are formed in the element isolation regions (FIG. 2C). In FIG. 2C, the reference number 5 indicates an active region.

Subsequently, the photosensitive film pattern is removed and the semiconductor substrate 1 washed, and after that, the semiconductor substrate 1 is thermally oxidized using the nitride film 3 as a mask, in order to improve the element isolation properties of the trench regions 4, and thus, an oxide film is grown on the inner walls of the trench regions 4 (not shown).

Next, an insulating film 6, which is a material with which the trenches are to be embedded, is deposited over the entire surface of the semiconductor substrate 1 in accordance with a chemical vapor deposition method so that the trench regions 4 are completely embedded, and the substrate is annealed if necessary, so that the density of the insulating film 6 with which the trench regions 4 are embedded increases (FIG. 2D).

After that, the insulating film 6 is removed in accordance with chemical mechanical polishing (CMP) utilizing the difference in polishing rate between the insulating film 6 and the nitride film 3, so that the upper surface of the insulating film in trench regions 4 becomes of the same level as the top of the nitride film 3, and thus, the insulating film 6 is flattened (FIG. 2E). Furthermore, the nitride film 3 which remains in the active regions 5 is removed through wet etching or dry etching, and thus, the element isolation regions are completed (FIG. 2F).

After that, appropriate impurities are implanted in the semiconductor substrate 1 under desired conditions and the pad oxide film 2 is removed (FIG. 2G). Subsequently, the gate insulating film 7 is formed, and gate electrodes 8 are formed through a well-known photolithographic method and dry etching, so that unit elements (herein, transistors) are formed (FIG. 1 and FIG. 2H).

As described above, in trench isolation methods, the CMP method is one method for flattening the insulating film with which trench regions are embedded in order to secure the photo margin required for more integrated unit elements and minimize the length of wires.

Flattening methods include BPSG reflow, aluminum reflow, SOG reflow and etch back methods, in addition to CMP methods. However, the CMP methods have an advantage, such that flattening in a wide region and flattening at low temperature are possible, which cannot be achieved through reflow or etch back. Therefore, the CMP methods are currently effective as flattening technology for various devices.

SUMMARY OF THE INVENTION

The present invention provides a method for manufacturing a semiconductor device comprising the steps of:

forming a first insulating film to be used as a mask for forming a trench region directly above a semiconductor substrate;

forming the trench region on the semiconductor substrate using the mask;

forming a second insulating film directly above the semiconductor substrate which includes the trench region and the first insulating film so that the second insulating film has a recess above the trench region and a protrusion above the first insulating film;

removing the protrusion down to the bottom of the recess as a first removal step; and removing the first insulating film and the second insulating film in accordance with a chemical mechanical polishing method so that the step formed of the recess and protrusion is reduced to 20 nm or less as a second removal step, wherein the first insulating film and the second insulating film are made of insulating films having no difference in the polishing rate under the same conditions for chemical mechanical polishing in the second removal step, and in the second removal step, a slurry including 0.2 to 0.6% by weight of abrasive particles is used.

In addition, the present invention provides a semiconductor device formed in accordance with the above described method, where steps formed of recess and protrusion, as described above, are 20 nm or less.

BRIEF DESCRIPTION OF THE DRAWINGS

FIGS. 4A to 4G are schematic cross sectional views for explaining a step of a manufacturing method for the semiconductor device of FIG. 3;

FIG. 5 is a schematic view of a semiconductor device of the present invention;

DESCRIPTION OF THE PREFERRED EMBODIMENTS

Figure 1:
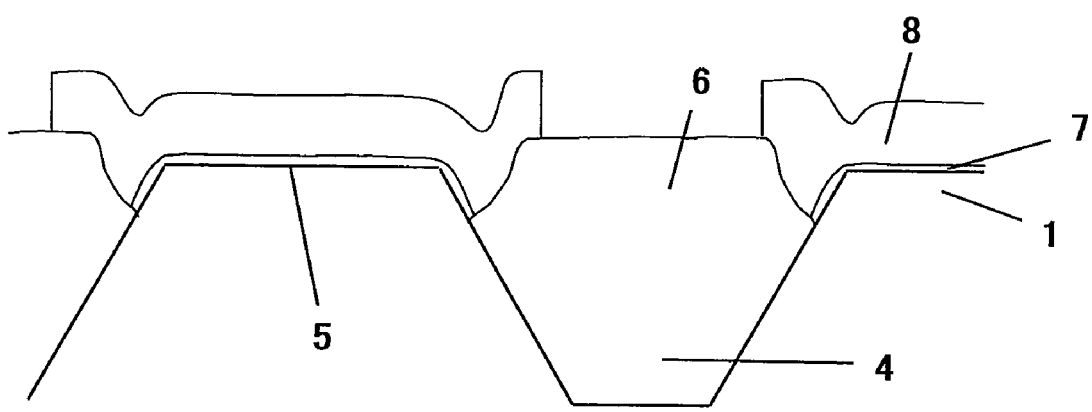
FIG. 1 is a schematic cross sectional view of a conventional semiconductor device.
Figure 2:
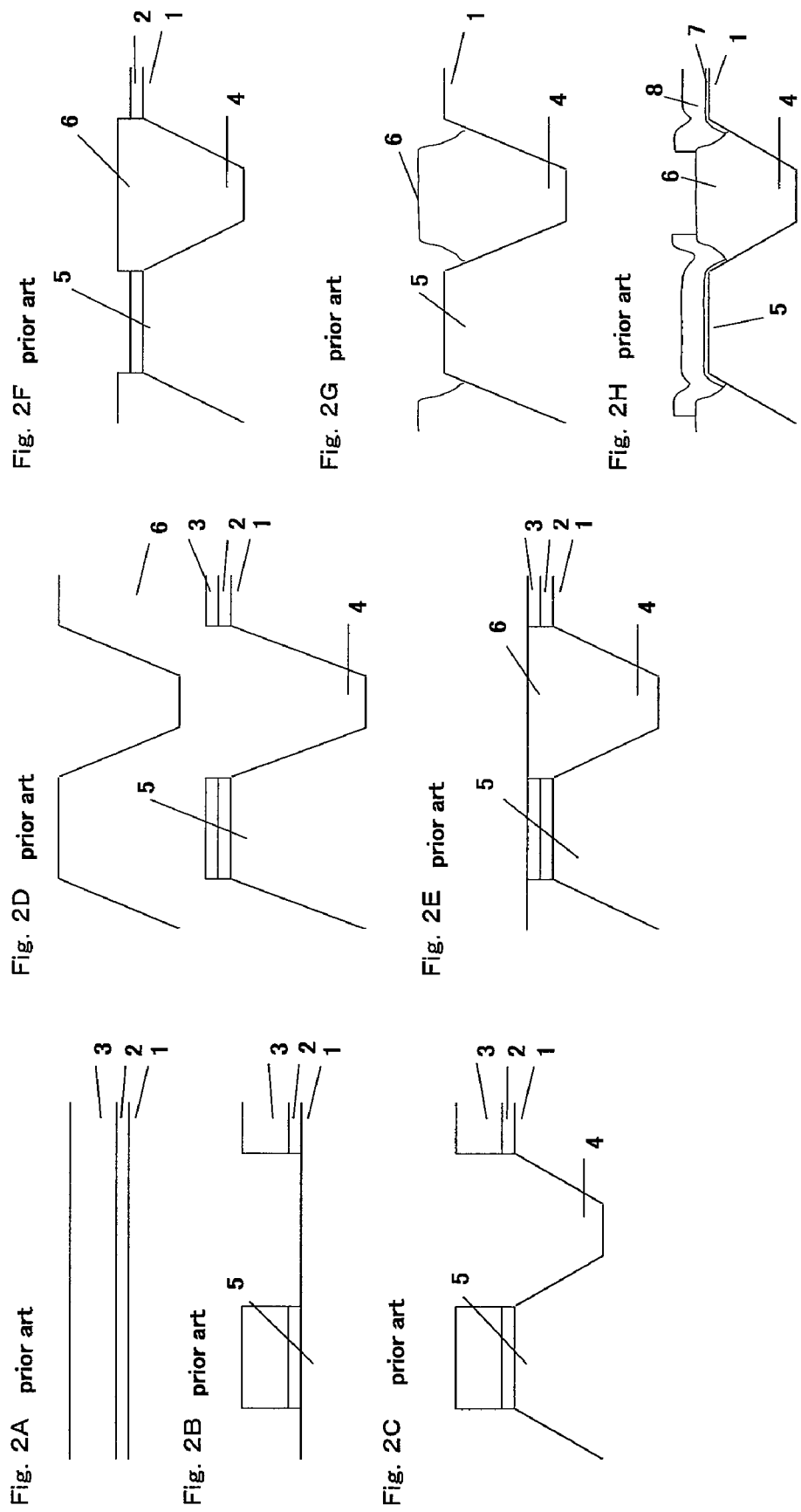
FIGS. 2A to 2H are schematic cross sectional views for explaining a step of a manufacturing method for the semiconductor device of FIG. 1.

In the trench isolation method shown in FIGS. 2A to 2H, a step is formed in the border portion between the active region 5 and the insulating film 6 with which the trench region 4 is embedded during the step of forming a gate electrode 8 after the flattening step is completed. In addition, the step causes a step in the gate electrode 8. The step in the gate electrode 8 causes partial concentration of an electrical field, and therefore, negatively affects the transistor properties. The adverse effects increase as an unit element becomes more miniaturized.

The cause of the step varies. For example, in some cases the step is formed when the insulating film 6 is removed using hydrogen fluoride or the like during the step of forming a gate insulating film 7 after the completion of the flattening step, and in other cases steps are formed when the insulating film 6 and the nitride film 3 in the border portions are excessively etched by hydrogen fluoride or the like, due to failure of the insulating film 6 in border portions between the nitride film 3 patterned above the active region 5 and the trench region 4 to be formed with the same film quality as in the flattened portions when the trench region 4 are embedded with the insulating film 6.

Less the step is formed when the insulating film is removed in the case where the time for removal is shorter. However, the time for removal is as short as currently possible in consideration of cost and environmental factors, and further reduction in the time for removal is difficult. Meanwhile, it is desired to keep the step caused by excessive etching to the minimum.

According to the present invention, there is no such problem, and it is possible to keep the step at a minimum.

Figure 3:
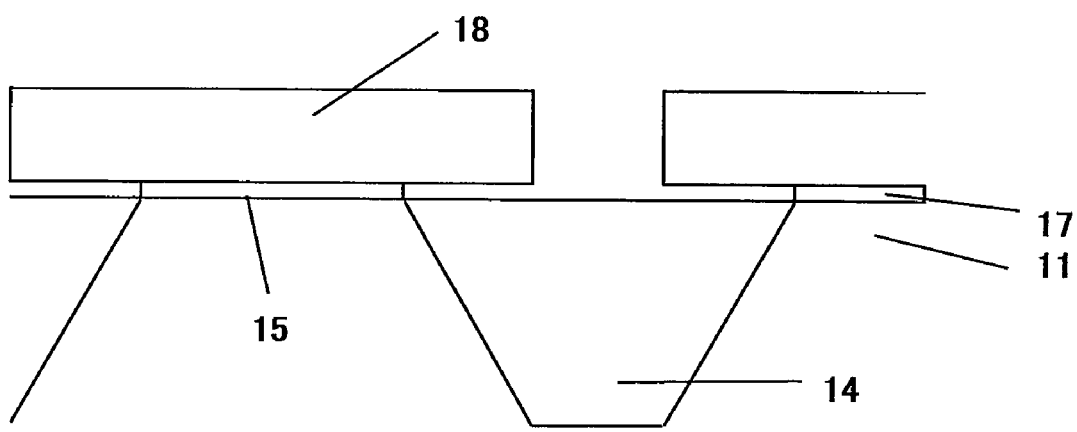
FIG. 3 is a schematic cross sectional view of a semiconductor device of the present invention.

Hereinafter, FIG. 3 is a schematic cross sectional diagram showing the semiconductor device according to a desirable embodiment of the present invention, and the schematic cross sectional diagrams in FIGS. 4A to 4G schematically show the steps in the method for manufacturing the semiconductor device in FIG. 3 according to a desirable embodiment. In the following, the present invention is described in reference to FIGS. 3 and 4A to 4G.

First, a first insulating film 12 is formed on a semiconductor substrate 11 so as to make contact with the semiconductor substrate 11 (FIG. 4A).

The semiconductor substrate is not particularly limited, as long as it can be used for a semiconductor device, and bulk substrates made of element semiconductors, such as silicon or germanium, or compound semiconductors, such as silicon germanium, can be cited as examples. The semiconductor material for forming the semiconductor substrate may be any of single crystal (formed through epitaxial growth, for example), polycrystal or amorphous crystal, though the amount of current flowing inside may be different.

The first insulating film is selected from among insulating films having no difference in the polishing rate from that of the second insulating film, which is formed afterward. "No difference" means that the difference in the polishing rate between the two insulating films is within a range of ±50 nm/min under the same conditions for chemical mechanical polishing. As long as this condition is met, the first insulating film may be made of any insulating film having the same or different composition as the second insulating film. As for the combination of insulating films having different compositions, expressed as "first insulating film/second insulating film", examples of the combinations include thermal oxide film/high density plasma CVD (HDP) film, plasma CVD (P-CVD) film/HDP film, and the like. It is preferable for the first insulating film to be an insulating film having the same composition as the second insulating film. Examples of insulating films having the same composition include silicon oxide films, HDP films, P-CVD films, and the like.

In the case where the semiconductor substrate is a silicon substrate, it is preferable for the first insulating film to be a silicon oxide film, and it is more preferable for it to be a silicon oxide film formed by thermally oxidizing a silicon substrate. In addition, it is preferable for the silicon oxide film to have a thickness of 2 nm to 30 nm when used as the first insulating film.

Next, the first insulating film 12 is processed to a mask for forming the trench region (FIG. 4B). The processing method is not particularly limited, and any publicly known method can be adopted. A method in which a resist pattern (not shown) may be formed on the first insulating film 12 in accordance with a photolithographic method, and this resist pattern used as a mask for etching can be cited as an example. Active regions 15 may include a wide active region (region where a large surface is secured for the semiconductor substrate) and a narrow active region (region where a small surface is secured for the semiconductor substrate).

Furthermore, a portion of the semiconductor substrate 11 is selectively removed using the first insulating film 12 and the resist pattern as a mask, and thus, the trench region (field region) 14 can be formed in the semiconductor substrate 11. Subsequently, the resist pattern is removed (FIG. 4C). In FIG. 4C, the reference number 15 indicates an active region. Here, the form of the trench region is not particularly limited, as long as it can electrically isolate a unit element to be formed afterward. The form of the trench region may be such that they are rectangles, trapezoids with a wider top than bottom, or upside-down triangles in a cross section, for example. In addition, it is preferable for the thickness of the trench region to be 5 nm to 50 nm, taking the electrically insulating properties between the unit elements into consideration, and it is preferable for the length of the bottom of the recesses to be 10 nm to 100 nm. Furthermore, the trench region may be formed in accordance with a method in which the resist pattern is removed and only the first insulating film 12 is used as a mask instead of a method in which both the first insulating film 12 and the resist pattern are used as a mask.

Furthermore, if necessary the semiconductor substrate may be washed. In addition, an insulating film (for example, a silicon oxide film formed through thermal oxidation) may be formed in inner wall portions of the trench region 14.

Next, a second insulating film 16 is formed on the semiconductor substrate 11, including in the trench region 14 and on the first insulating film 12, so as to make contact with these (FIG. 4D). The second insulating film is embedded in the trench region, and the top of the first insulating film is also almost covered. In addition, the unevenness of the base is reflected in the second insulating film formed on top, which has recesses above the trench region and a protrusion above the first insulating film.

As described above, the second insulating film may be formed of an insulating film having the same composition or a different composition as the first insulating film. In the case where the semiconductor substrate is a silicon substrate, it is preferable for the second insulating film to be a silicon oxide film. The thickness of the silicon oxide film is not particularly limited when used as the second insulating film, as long as the trench region can be embedded with it. It is preferable for the thickness of the second insulating film formed the protrusion to be 50 nm to 300 nm between the upper surface of the first insulating film and the upper surface of the second insulating film with which the trench region is embedded.

Furthermore, it is more preferable for the second insulating film to be an HDP-USG (high density plasma undoped silicate glass) film (non-doped silicon oxide film fabricated in accordance with high density plasma (HDP) CVD method).

The HDP CVD method is a method of performing deposition and etching of a film at the same time. This method is characterized in that the gap in a step portion having a high aspect ratio (trench region 14) can be effectively filled in. That is to say, in step portion adjacent to the trench region 14, the rate of deposition of the second insulating film can be made very low. In addition, in the case where there are wide and narrow active regions, the second insulating film can be formed thin on top of the narrow active regions and thick on top of the wide active region.

Subsequently, as shown in FIG. 4E, the portion of the second insulating film 16 that form the protrusion is removed so that the whole becomes level with the bottom of the recess (first removal step). In other words, the second insulating film 16 is removed until the level of the upper surface of the second insulating film 16 above the first insulating film 12 becomes the same as the upper surface of the second insulating film 16 in the trench region 14. The end of removal need not be at the same point in time as when the level of the upper surface of the second insulating film 16 above the first insulating film 12 becomes the same as the level of the upper surface of the second insulating film in the trench region, and may be at the point in time when the second insulating film in the trench region is removed to a certain extent, as long as the level of the upper surface of the second insulating film in the trench region is higher than the upper surface of the first insulating film. The second insulating film in the trench region may be removed by approximately 20 nm to 30 nm. As the removal method, a publicly known method such as a CMP method can be exemplified.

Here, no stopper film is used in the present invention, and therefore, the end point for the first removal step can be detected in accordance with a technique for monitoring fluctuation in the pressure applied to the polishing pad when a CMP method used, for example. In addition, at the stage where the protrusion is removed, the polishing rate significantly lowers in the first removal step, and therefore, it becomes unnecessary to detect the end point when the time required for sufficiently removing the protrusion is preset.

In the case where a CMP method is adopted in the first removal step, it is preferable to remove the second insulating film under such conditions that the protrusion can be preferentially removed (such conditions that the polishing rate is higher for the protrusion than for the recess). A slurry including abrasive particles (for example, cerium oxide particles) can be used as the abrasive in accordance with the CMP method. It is preferable for the concentration of the abrasive particles in the slurry to be 0.5 to 1.5% by weight. In addition, the abrasive may include a surfactant and a solvent (for example, water) in addition to abrasive particles. It is preferable for the concentration of the surfactant to be 2 to 4% by weight. The abrasive particles, the surfactant and the water which form the abrasive may be separately dropped onto the semiconductor substrate or mixed before dropping. In the case where they are separately dropped, the abrasive particles are usually used together with a solvent in the form of a dispersing liquid. At this time, it is desirable for the pressure applied to the wafer to be 1 to 6 PSi.

Furthermore, it is preferable for the first removal step to be carried out under such conditions that the polishing rate for the second insulating film on top of the first insulating film to be greater than 0 nm/min and less than 50 nm/min. When the polishing rate is within this range, the protrusion can be preferentially removed, so that flattening can be achieved.

Next, the first insulating film and the second insulating film are removed in accordance with a CMP method until they have a predetermined film thickness (second removal step). As a result of removal, the step formed by the recess and protrusion can be reduced to 20 nm or less. The reason why it is useful for the step to be 20 nm or less is described below.

The removal of the first insulating film and the second insulating film is not particularly limited, and the second insulating film may be partially or entirely removed, or the second insulating film may be entirely removed while the first insulating film is partially or entirely removed. It is preferable for the amount of removal of the first insulating film to be determined by the necessary amount of removal of the insulating film for preventing the active regions from being exposed before the formation of the gate insulating film when a transistor is subsequently formed, for example. The first insulating film can be removed so that approximately 10 to 30 nm remain, for example.

In the present invention, no stopper film is used, and thus, the state where there are no step in the end portion of the trench region at the stage where the second removal step is completed can be maintained until the subsequent element forming step (for example, gate electrode film forming step).

In the case where a CMP method is adopted in the first removal step, there may be a lot of scratching on the surface of the second insulating film, due to the pressure at the time of polishing. It is possible to remove scratches if necessary in the second removal step. In this case, it is preferable for the polishing rate in the second removal step to be faster than in the first removal step. Concretely, it is preferable to set the polishing rate to approximately 50 nm/min to 500 nm/min, and it is more preferable to set approximately at 200 nm/min to 300 nm/min. When the polishing rate is within this range, the amount of scratching after the first removal step can be set at 1/100 or less while controlling the thickness of the insulating film above the semiconductor substrate.

Incidentally, the upper surface formed of the second insulating film or the first insulating film and the setting insulating film is approximately flat after the first removal step, and there is substantially no step in the end portion of the trench region. In addition, the first insulating film and the second insulating film are formed of insulating films having no difference in the polishing rate, and therefore, the step in the end portion of the trench region can be made significantly small in comparison with conventional cases, where there is a difference between the insulating films. Accordingly, the polishing rate for the insulating films can be made the same on top of the first insulating film and on top of the trench region in the second removal step, as compared to in the prior art, where a stopper film is used.

In the second removal step, a slurry including abrasive particles (for example, cerium oxide particles) is used as the abrasive in the CMP method. It is preferable for the concentration of the abrasive particles in the slurry to be 0.2 to 0.6% by weight. In addition, the abrasive may include a surfactant and a solvent (for example, water) in addition to abrasive particles. It is preferable for the concentration of the surfactant to be 0.2 to 1.2% by weight. The abrasive particles, the surfactant and the water which form the abrasive may be separately dropped onto the semiconductor substrates or mixed before dropping. In the case where they are separately dropped, the abrasive particles are usually used together with a solvent in the form of a dispersing liquid. At this time, it is desirable for the pressure applied to the wafer to be 1 PSi to 6 PSi.

In the case where the first removal step is carried out in accordance with a CMP method, the first removal step and the second removal step can be carried out continuously. It is preferable for the device for the CMP method to be such a device that the amount of abrasive particle dispersing liquid, surfactant and water dropped can be changed, in order to carry out the first and second removal steps continuously.

There are the following two advantages in carrying out polishing in the first and second removal steps continuously.

(1) The depth and width of scratches formed in the first removal step can be made greater through etching in a washing step (for example, washing using hydrogen fluoride (HF)) which may or may not be carried out after polishing. In the case where polishing in the second removal step is carried out discontinuously in this state, there is a possibility that abrasive particles may remain in the grooves of the expanded scratches. Such residue can be prevented by carrying out the first and second removal steps continuously.

(2) When polishing is carried out in two steps, the productivity deteriorates in terms of cost and performance of processing in the facility. Such deterioration can be prevented by carrying out the first and second removal steps continuously.

After the second removal step, the unit element can be formed in the active region 15 by carrying out the steps in accordance with the unit element which is desired to be formed. In the following, an example of the process in the case where the unit element is transistor is described.

The first insulating film 12 remaining in the active region 15 after the second removal step is entirely removed using HF or DHF (diluted HF). Thereafter, thermal oxidation is performed again so as to form an oxide film in the active region. Next, a photoresist mask having a pattern for forming a well region is formed in a predetermined region, and ions are implanted via the photoresist mask, so that the well region is formed. Appropriate conditions can be set for ion implantation in accordance with the performance of the desired transistor.

The oxidation film in the active region 15 is entirely removed using HF or DHF (FIG. 4F). A gate insulating film 17 and gate electrode 18 are formed on the active region 15 after the removal of the oxide film (FIGS. 3 and 4G). Thereafter, source/drain regions 19 are formed in accordance with a predetermined method, and thus, the transistor can be obtained.

FIGS. 5a and 5b show an example of the obtained transistor. FIG. 5a is a schematic plan diagram showing a transistor, FIG. 5b is a schematic cross sectional diagram along A-B showing the transistor in FIG. 5a, and FIG. 5c is a schematic cross sectional diagram along C-D showing the transistor in FIG. 5a.

In the obtained transistor, the entire surface can be additionally coated with an interlayer insulating film 20, a contact 21 can be formed in the interlayer insulating film, and a wire layer 22 can be formed so as to make electrical connection with the contact 21. FIG. 5d is a schematic cross sectional diagram along A-B after the additional formation of a wire layer in the transistor in FIG. 5a, and FIG. 5e is a schematic cross sectional diagram along C-D after the additional formation of a wire layer in the transistor in FIG. 5a. Here, a well-known method can be adopted as the method for forming the interlayer insulating film, the contact and the wiring layer.

Though transistor is cited as examples of the unit element in the above, other unit elements, such as capacitor, diode, thyristor, resistor and wire can be formed in the active region obtained in accordance with the manufacturing method of the present invention.

Figure 6:
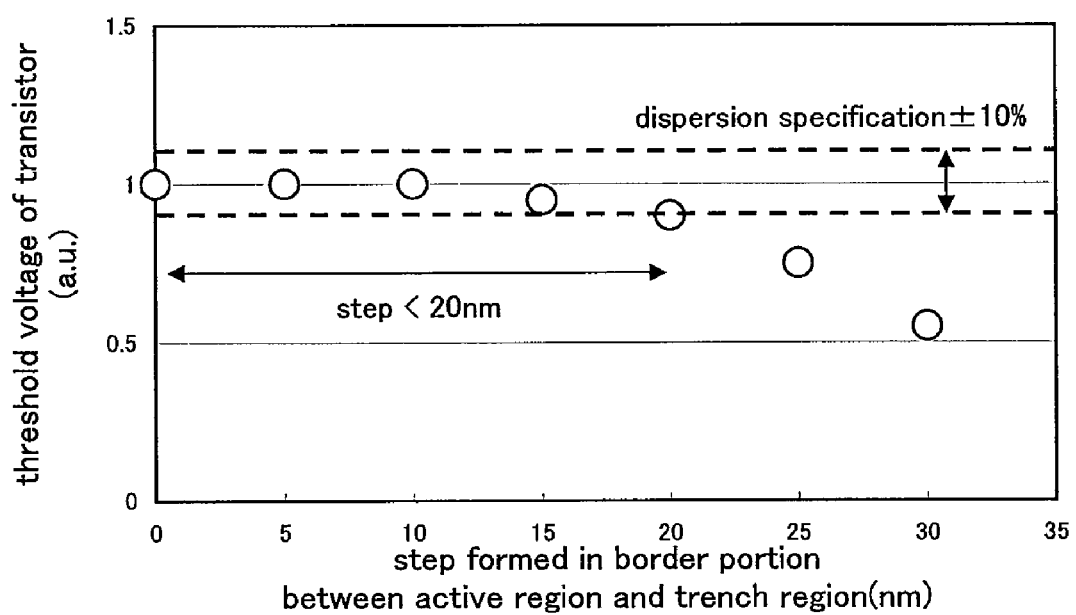
FIG. 6 is a graph showing the relationship between the threshold voltage of the transistor and the step.

The reason why it is useful to make the step 20 nm or less is described below in reference to FIG. 6. FIG. 6 is a graph showing the relationship between the threshold voltage of the transistor and the step. The seven types of transistors for which the threshold voltage is plotted in FIG. 6 have the same configuration, except that the size of the steps is different. Concretely, they are the same in that a silicon substrate is used as the semiconductor substrate, a silicon oxide film formed in accordance with a thermal oxidation method so as to have a thickness of 2 nm is used as the gate insulating film, a polysilicon film having a thickness of 20 nm is used as the gate electrode, impurity regions of 1 E 15 $cm^{-3}$ (impurity species: B+, P+, As+) are used as the source/drain regions, a silicon oxide film formed in accordance with an HDPCVD method is used as the second insulating film, the gate length is approximately 0.1 μm, and the gate width is 1.0 μm.

Furthermore, the steps can be adjusted through wet etching using hydrogen fluoride or in accordance with a CMP method. In particular, adjustment through wet etching makes for the least inconsistency, and thus is most appropriate.

Here, the case where the step is 0 nm means in a state in which there are no steps between the active region and the trench region, so that the two regions are in a horizontal state. In addition, the case where the step is smaller than 0 nm (that is to say, negative step) means a state in which the active region is lower than the trench region, and an insulating film (first insulating film or first insulating film and second insulating film) remains in the active region.

As shown in FIG. 6, in the case where the step exceeds 20 nm, the electrical field is concentrated in the border portion between the active region and the trench region on the silicon substrate. The threshold value is outside the allowable range of ±10% as specified for the dispersion. As a result, it can be seen that a problem arises with the transistor properties.

Here, though not shown in FIG. 6, in the case where the step is smaller than 0 nm at the stage where gate electrodes are formed, the state becomes such that the insulating film formed in a preceding step, before the formation of the gate insulating film, remains on the silicon substrate, and the transistor malfunctions.

As is clear from FIG. 6, it is effective to set the step in a range from 0 nm to 20 nm, in order to keep the range as specified for the dispersion within ±10% of the mean value.

In the present invention, no stopper film is used, and therefore, more flat element isolation regions can be obtained than in conventional methods where a stopper film is used. In addition, in the case where the unit element is the transistor, for example, the flatness after use of the CMP method can be maintained until the time when the gate electrode is formed. As a result, the step is reduced in the interface between the active region and the element isolation region, so that concentration of an electrical field resulting from the step in the gate electrode can be lessened, and thus, the transistor properties can be improved.

The invention thus described, it will be obvious that the same may be varied in many ways. Such variations are not to be regarded as a departure from the spirits and scope of the invention, and all such modifications as would be obvious to one skilled in the art are intended to be included within the scope of the following claims.

What is claimed is:

1. A method for manufacturing a semiconductor device, comprising:

forming a first insulating film to be used as a mask for forming a trench region directly above a semiconductor substrate;

forming the trench region on the semiconductor substrate using the mask;

forming a second insulating film directly above the semiconductor substrate which includes the trench region and the first insulating film so that the second insulating film has a recess above the trench region and a protrusion above the first insulating film;

removing the protrusion down to the bottom of the recess as a first removal step; and removing the first insulating film and the second insulating film in accordance with a chemical mechanical polishing method so that the step formed of the recess and protrusion is reduced to 20 nm or less as a second removal step, wherein the first insulating film and the second insulating film are made of insulating films having no difference in the polishing rate under the same conditions for chemical mechanical polishing in the second removal step, in the second removal step, a slurry including 0.2 to 0.6% by weight of abrasive particles is used, and the first insulating film and the second insulating film are insulating films having the same composition and the second insulating film is a silicon oxide film formed by a high density plasma CVD method.

2. The method for manufacturing a semiconductor device of claim 1, wherein the second insulating film composing the protrusion is removed by a chemical mechanical polishing in the first removal step, the polishing rate for the first removal step is less than 50 nm/min, and the polishing rate for the second removal step is 50 to 500 nm/min.

3. The method for manufacturing a semiconductor device of claim 1, wherein the first removal step and the second removal step are carried out continuously.

4. The method for manufacturing a semiconductor device of claim 1, wherein the first insulating film and the second insulating film have the difference in the polishing rate within a range of ±50 nm/min under the same conditions for chemical mechanical polishing.

5. The method for manufacturing a semiconductor device of claim 1, wherein the second insulating film formed the protrusion has the thickness of 50 nm to 300 nm between an upper surface of the first insulating film and an upper surface of the second insulating film with which the trench region is embedded.

6. The method for manufacturing a semiconductor device of claim 1, wherein the second insulating film on the first insulating film after the second removal step has the thickness 10 to 30 nm.

7. A semiconductor device formed in accordance with the method of the claim 1, where the step formed of the recess and protrusion is reduced to 20 nm or less.

* * * * *